United States Patent
Watanabe et al.

[19]

[11] Patent Number: 6,106,610
[45] Date of Patent: Aug. 22, 2000

[54] QUARTZ GLASS CRUCIBLE FOR PRODUCING SILICONE SINGLE CRYSTAL AND METHOD FOR PRODUCING THE CRUCIBLE

[75] Inventors: Hiroyuki Watanabe; Tatsuhiro Sato, both of Takefu, Japan

[73] Assignees: Heraeus Quarzglas GmbH & Co. KG, Hanau, Germany; Shin-Etsu Quartz Products Co., Ltd., Tokyo, Japan

[21] Appl. No.: 09/163,255

[22] Filed: Sep. 30, 1998

[30] Foreign Application Priority Data

Sep. 30, 1997 [JP] Japan ................................. 9-266762

[51] Int. Cl.[7] ......................................... C30B 15/20
[52] U.S. Cl. ..................... 117/13; 65/30.1; 65/33; 65/DIG. 8; 427/255
[58] Field of Search .................... 117/19, 20, 13; 65/30.1, 33.1, 173, DIG. 8, 33; 427/93, 167, 255, 376.2; 501/1

[56] References Cited

U.S. PATENT DOCUMENTS

| | | |
|---|---|---|
| 3,772,134 | 11/1973 | Rau ............................................. 65/33 |
| 3,776,809 | 12/1973 | Baumer et al. ....................... 65/DIG. 8 |
| 4,528,163 | 7/1985 | Albrecht .................................... 117/220 |
| 4,935,046 | 6/1990 | Uchikawa et al. ....................... 65/18.2 |

FOREIGN PATENT DOCUMENTS 409286691A  11/1997  Japan .

*Primary Examiner*—Felisa Hiteshew
*Attorney, Agent, or Firm*—Milde, Hoffberg & Macklin, LLP

[57] ABSTRACT

A method for producing an improved quartz glass crucible for pulling up silicon single crystals comprises forming a premolding by feeding powdered silicon dioxide into the mold and by then forming it into a layer along the inner surface of the mold; forming a crucible base body of a translucent quartz layer by heating the premolding from the inner side, thereby partially melting the powdered silicon dioxide, followed by cooling and solidifying the melt; forming a crystallization-promoter containing layer along the internal wall surface of the crucible body by scattering the crystallization promoter on the surface of the internal wall of the crucible body during or after forming the crucible base body; and forming a synthetic quartz glass inner layer by scattering and fusing a powder of silicon dioxide on the crystallization promoter-containing layer that is formed along the internal wall surface of the crucible base body.

16 Claims, 2 Drawing Sheets

QUARTZ GLASS CRUCIBLE FOR PRODUCING SILICONE SINGLE CRYSTAL AND METHOD FOR PRODUCING THE CRUCIBLE

FIELD OF THE INVENTION

The present invention relates to a quartz glass crucible for use in pulling up silicon single crystals and to a method for producing the crucible. In further detail, it relates to a quartz glass crucible comprising a rotatable mold of an open-top type, and to a method for producing the mold.

PRIOR ART

Conventionally, single crystal materials, such as single crystal semiconductor materials, have been produced by a widely employed Czochralski method. According to this method, polycrystalline silicon is molten inside a vessel, and an edge of a seed crystal is immersed in the molten bath and is rotatably pulled up so as to allow a single crystal having the same crystallographic orientation to be grown on the seed crystal. In general, a quartz glass crucible is used for the vessel from which the single crystal is pulled up.

It is common for quartz glass crucibles to be used for a long period of time while retaining the silicon melt at a temperature not lower than 1400° C. In such a case, brown colored cristobalite tends to precipitate on the surface of the quartz glass which has been brought into contact with the silicon melt, and the cristobalite precipitates have been found to drop into the melt and cause dislocations in single crystals.

With the increasing size of wafers these days, the size of quartz glass crucibles for use in the fabrication of single crystals is also increasing. However, with the increasing duration of their use, more brown-colored cristobalite is generated and drops into the melt, thereby increasing the formation of dislocations in the crystal.

In the light of these circumstances, it has been proposed to use crucibles such as the one disclosed in unexamined published Japanese patent application Hei. 8-2932, in which roughening of the inner surface is prevented by forming a 1 mm or less thick coated layer or a melt-solidified layer of a crystallization promoter on the inner surface of the quartz glass crucible for pulling up silicon single crystal, so that a crystalline layer may be formed on the inner surface of the crucible during the fabrication of the single crystal. In EP-A 753 605 and EP-A1 748 885, it is suggested to add a crystallization promoter in the form Barium in the inner and the outer surfaces of the quartz glass crucible. However, in such crucibles, Barium which is present in the inner surface tends to be incorporated as an impurity into the single crystal, and, at the same time, it contaminates the graphite crucible which retains the quartz glass crucible.

Another method is proposed in unexamined published Japanese patent application Hei. 9-52791, which comprises the converting of silica glass into cristobalite by gradually cooling the glass melt. The incorporation of impurities in single crystals can be avoided by adopting this proposal; however, the productivity is so low that the method is far from satisfactory.

SUMMARY OF THE INVENTION

It is an object of the invention to provide an improved quartz glass crucible for pulling up silicon single crystals that has improved productivity.

It is another object of the invention to provide an improved crucible for producing silicon single crystals having improved quality.

It is also an object of the invention to provide an improved crucible which is capable of increasing the ratio of producing single crystals by selectively crystallizing only the synthetic quartz glass layer of the internal layer having particularly low viscosity, thereby suppressing the roughening of the inner surface during pulling up the silicon single crystal.

It is yet another object of the invention to provide an improved crucible that suppresses defects in the single crystal to an extremely low level by reducing incorporation of impurities into the single crystal.

These objects and other objects which will become apparent from the following specification are provided by a method for producing an improved quartz glass crucible for pulling up silicon single crystal using a rotatable mold of an open-top type, comprising the following steps:

(a) forming a pre-molding by feeding powdered silicon dioxide into said mold, and by then forming it into a layer along the inner surface of the mold;

(b) forming a crucible base body of a translucent quartz glass layer by heating said pre-molding from the inner side, thereby partially melting said powdered silicon dioxide, followed by cooling and solidifying the melt;

(c) forming a crystallization promoter-containing layer along the internal wall surface of said crucible base body by scattering the crystallization promoter on the surface of the internal wall of the crucible body during or after forming the crucible base body, and (d) forming a synthetic quartz glass layer by scattering and fusing a powder of silicon dioxide on the crystallization promoter-containing layer that is formed along the internal wall surface of said crucible base body.

In the following description, a "high temperature atmosphere" means a temperature of at least 1800° C.

In the aforementioned step (c), it is preferred that a crystallization promoter-containing layer is formed along the internal wall surface of the crucible base, by forming a high temperature gaseous atmosphere on the inner side of the crucible base and supplying the crystallization promoter to the high temperature gaseous atmosphere, thereby melting the crystallization promoter by the high temperature gaseous atmosphere and scattering it against the internal wall plane of the crucible base body. The crystallization promoter may be added in a pure form or it may be mixed with powdered silicon dioxide.

In step (d) above, preferably, the powder of synthetic silicon dioxide is supplied into the high temperature gaseous atmosphere to fuse it, and then, it is scattered against the crystallization promoter-containing layer provided on the internal wall surface of the crucible base body.

A first embodiment of an improved quartz glass crucible for producing silicon single crystal comprises an outer layer comprising a crucible base body made of a translucent quartz glass layer, an internal layer comprising a synthetic quartz glass layer formed on the inner side of said outer layer, and a crystallization promoter-containing layer interposed between said internal and outer layers.

In a preferred embodiment, the promoter-containing layer is formed on the internal wall surface of said crucible base body, so that the crystallization promoter-containing layer induces crystallization of the whole synthetic quartz glass layer, whereby the crystallization starts at the boundary between the synthetic quartz glass layer and the crystallization promoter-containing layer.

The amount of the crystallization promoter that is contained in the crystallization promoter-containing layer is in a range of from $1\times10^{-5}$ to $1\times10^{-8}$ M/cm2, wherein the dimension "$cm^2$" refers to the outer surface area of the inner synthetic quartz glass layer and the dimension M refers to the amount of the crystallization promoter expressed in mol. If the amount of the crystallization promoter added is less than $1\times10^{-5}$ M/$cm^2$, the effect is too small, and if the amount added exceeds $1\times10^{-8}$ M/$cm^2$, crystallization occurs after completion of the production so that cracks generate on the inner surface and cause peeling off of cristobalite, thereby making its use unfeasible. The amount of the crystallization promoter which is in contact with the inner synthetic quartz glass layer is the most important feature for inducing the crystallization of the inner synthetic quartz glass layer. Therefore the dimension for the amount of the crystallization promoter as mentioned above refers to the surface area of the inner synthetic quartz glass layer. The upper and lower limits given above for the amount of the crystallization promoter are valid under the presupposition that the thickness of the crystallization promoter-containing layer is very small, i.e. smaller than 0.3 mm. In that case, the amount of crystallization promoter may be determined by analyzing the promoter concentration in the crucible material obtained from a bore in the crucible wall having a section area of 1 $cm^2$.

Useful as the crystallization promoter is an element belonging to Group 2a, Group 3a or Group 3b of the Periodic Table. Group 2a elements include magnesium, strontium, calcium, and barium. Group 3a elements include aluminum. However, particularly preferred is a barium compound, such as barium hydroxide or barium oxide.

The crystallization promoter can be used either alone or as a mixture with a powder of synthetic silicon dioxide. The method for adding the crystallization promoter includes spraying an aqueous solution thereof while forming the outer layer or after forming the outer layer, or depositing a synthetic silicon dioxide powder sufficiently impregnated with the aqueous solution. The layer containing the crystallization promoter is formed as a coated film or a solid solution layer on the surface of the internal layer.

Useful as the powdered silicon dioxide used in step a) is a powder of naturally occurring quartz. If the outer layer is naturally occurring quartz, there is a disadvantage in that the synthetic quartz glass layer in the internal layer is contaminated by an element transferred from the outer layer, for instance, Li.

In the case above, it is possible to produce the internal and the outer layers using synthetic quartz glass by utilizing synthetic quartz glass powder as the silicon dioxide powder. However, there remains a problem that the viscosity becomes so low as to make it easily affected by thermal distortion. However, by interposing a crystallization promoter-containing layer between the internal and the outer layers, there is an advantage that it can be thermally reinforced by selectively crystallizing from the crystallization promoter-containing layer to the outer and the inner directions.

The principle of the present invention is that the crystallization promoter-containing layer containing a crystallization promoter, for example Ba, which is present between the internal layer, i.e. synthetic quartz glass, and the outer layer, i.e., for instance, naturally occurring quartz glass, provides the crystallization nuclei by the heat treatment, and they selectively allow the synthetic quartz glass layer on the inner surface to undergo phase transition to cristobalite having a melting point of 1700 ° C. or higher. Crystallization of the synthetic quartz glass layer begins at the boundary between the crystallization promoter-containing layer and the synthetic quartz glass layer, and the crystallization proceeds towards the inner surface of the crucible.

The synthetic quartz glass layer is thereby changed to a reinforced state by the phase transition to cristobalite. By using the synthetic quartz glass layer which has undergone phase transition to cristobalite, it is possible to suppress the conventionally observed problems, i.e., the elution of quartz glass into silicon melt, the brown-colored spots that are formed by the reaction of quartz glass and silicon melt, and the further formation of a polycrystalline state due to peeling off of the brown-colored spots.

In further detail, the method for producing a quartz glass crucible for silicon single crystal according to the present invention comprises feeding a powder of a naturally occurring quartz into the rotatable mold of the open-top type to form a layered formation to thereby provide a pre-molding along the inner surface of the mold, heating from the inner surface of the pre-molding to partially fuse the powder of naturally occurring quartz by a high temperature gaseous atmosphere, cooling and solidifying the melt to form a crucible base made of the translucent quartz glass layer. While or after forming the crucible base, a crystallization promoter, such as a synthetic silicon dioxide powder containing a barium compound or a barium compound alone, is continuously supplied and scattered on the surface of the inner wall of the crucible base to form a crystallization promoter-containing layer of barium having a high concentration. Then, a powder of synthetic silicon dioxide is supplied into the high temperature gaseous atmosphere and allowed to scatter on the surface of the inner wall to thereby form a synthetic quartz glass layer on the crystallization promoter-containing layer.

PREFERRED EMBODIMENT OF THE INVENTION

An embodiment according to the present invention is explained below with reference to FIG. 1 Referring to FIG. 1, a rotatable mold 1 is equipped with a rotation shaft 2. The mold 1 comprises a cavity 1a formed therein, and a base body 3 of the quartz crucible is placed inside the mold cavity 1a, which constitutes a translucent quartz glass layer, i.e., the outer layer, formed by a silicon dioxide powder, for instance, a powder of naturally occurring quartz.

The base body 3 is produced by feeding a powder of silicon dioxide into the rotating mold 1 along the inner wall thereof to form a layer to thereby provide a pre-molding having the predetermined shape of the crucible, and the quartz powder is melted by heating internally, followed by cooling.

Figure 1:
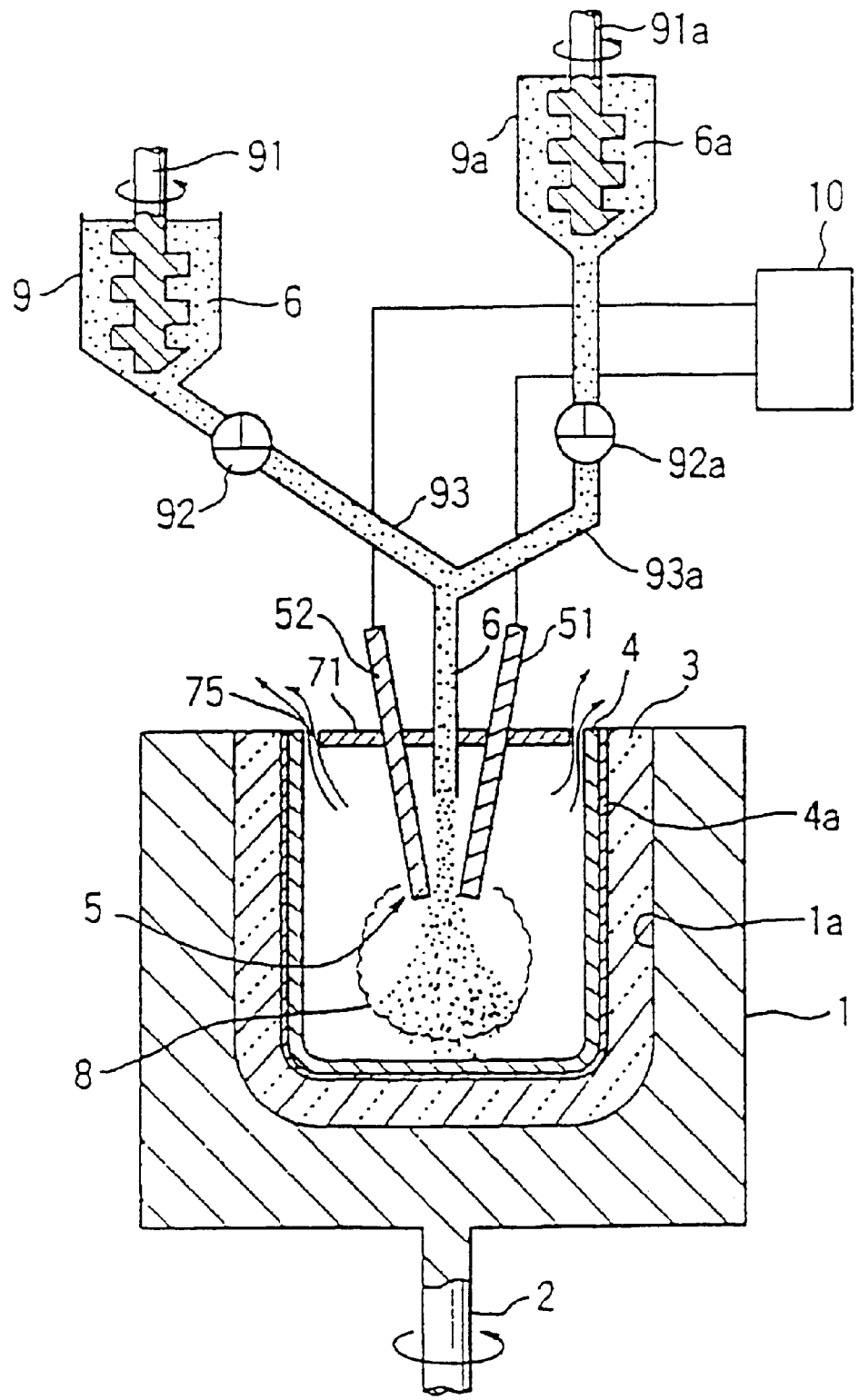
FIG. 1 shows a cross section view of an apparatus for use in practicing the method according to the present invention, and of a method for producing quartz crucibles using the apparatus.

To heat internally, as is shown in FIG. 1, an arc discharge apparatus 5 equipped with carbon electrodes 51 and 52 connected to a power source 10 can be used. Otherwise, a plasma discharge apparatus can be used in place of the arc discharge apparatus 5. For the details of producing the base body 3, reference can be made to the detailed description in an examined published Japanese patent application Hei. 4-22861.

In order to form the internal layer 4, the apparatus is equipped with a quartz powder supply reservoir which stores the synthetic silicon dioxide powder 6 above the mold 1. The supply reservoir 9 is connected to an output pipe 93 provided with a measuring feeder 92. A stirrer blade 91 is placed inside the supply reservoir 9. The upper portion of the mold 1 is covered with a lid 71 except for a slit opening 75.

After a base body 3 is formed, or during the base body 3 is formed, a crystallization promoter, in form of a barium compound is supplied contained in the synthetic silicon dioxide powder to the inside of the base body 3 while continuing heating by the discharge from carbon electrodes 51 and 52. By operating the arc discharge apparatus 5, a high temperature gaseous atmosphere 8 is formed inside the base body 3. Thus, the crystallization promoter is supplied to the high temperature gaseous atmosphere 8.

The crystallization promoter supplied to the high temperature gaseous atmosphere 8 is melted at least partially by the heat generated by the high temperature gaseous atmosphere 8, and, at the same time, is scattered against the internal wall plane of the base body 3, so that it may adhere to the internal wall plane of the base body 3. Thus, a crystallization promoter-containing layer 4a is formed monolithically fused with the base body 3. The crystallization promoter-containing layer 4a contains the crystallization promoter at a predetermined concentration.

Then, the measuring feeder 92 which supplies the synthetic silicon dioxide powder 6 is opened at a controlled opening degree to supply the synthetic silicon dioxide powder 6 alone from the output pipe 93, to thereby form a substantially pore-free quartz glass layer, i.e., an internal layer 4, on the inner plane of the base body 3. For the method of forming the internal layer 4, reference can be made to the detailed description in the aforementioned examined published Japanese patent application Hei. 4-22861.

Figure 2:
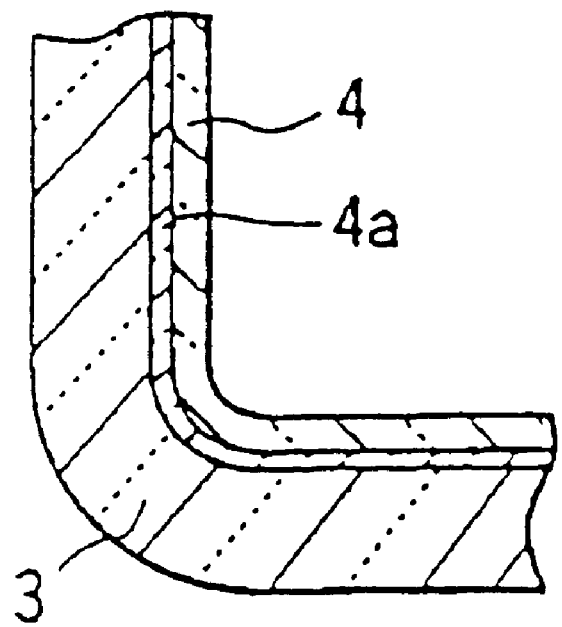
FIG. 2 shows a partial cross section view showing a part of the quartz crucible for pulling up silicon single crystal, obtained by the method according to the present invention.

FIG. 2 shows the cross section view of the quartz crucible obtained by the method above. The quartz crucible according to the present invention comprises an outer layer, i.e., a base body 3, formed by heating and melting internally a silicon dioxide powder, for instance, a powder of naturally occurring quartz; an internal layer 4 formed by discharging a synthetic silicon dioxide powder inside a high temperature gaseous atmosphere and allowing it to melt and scatter, thereby adhering the powder to the inner wall plane of the base body 3; and a crystallization promoter-containing layer 4a formed between the outer layer 3 and the internal layer 4.

EXAMPLE 1

A 22-inch quartz glass crucible was produced by using an apparatus shown in FIG. 1. In the production, 20 kg of a powder of naturally occurring quartz was supplied through the upper opening of the rotating mold and shaped to form a pre-molding which corresponds to the outer layer. The surface area of the inner wall of the outer layer was about 8000 cm$^2$.

The pre-molding was then internally heated at a temperature of about 1900° C. and melted to form an outer layer, and an aqueous barium hydroxide solution containing 10 mM of Ba ions was sprayed to provide Ba ions at a concentration of approximately 10 mg per 1 square centimeter of the surface area of the inner wall of the outer layer. The Ba-containing film thereby obtained has a thickness of about 0.2 mm. Subsequently, 3 kg of synthetic silicon dioxide powder was supplied to the high temperature atmosphere (about 1900° C.) to form a synthetic quartz glass layer as a transparent internal layer.

Table 1 shows the result obtained on a piece of quartz glass specimen 20×50×10 mm in size cut out from the crucible and heated at 1450° C. for 3 hours. Referring to Table 1, it is clearly confirmed that the transparent layer is wholly converted into cristobalite to result in a considerably favorable quartz glass crucible.

COMPARATIVE EXAMPLE 1

A quartz glass crucible was produced under the same conditions used in Example 1 by using the apparatus shown in FIG. 1, except for not spraying the aqueous barium hydroxide solution. In Table 1 is shown the result obtained on a piece of quartz glass specimen 20×50 ×10 mm in size cut out from the crucible and heated at 1450° for 3 hours. As may be seen from Table 1, no conversion to cristobalite occurred on the entire transparent layer.

TABLE 1

| | State of Inner Surface |
|---|---|
| Example 1 | Entire transparent layer changed into cristobalite |
| Comparative Example 1 | No difference observed after heating |

As described above, by using the quartz glass crucible according to the present invention in pulling up a silicon single crystal, the transparent layer of the quartz glass crucible can be selectively crystallized. Thus, because the impurity which functions as a crystallization promoter is not brought into direct contact with the silicon melt, the incorporation of an impurity into the silicon single crystal can be prevented from occurring. Accordingly, the present invention is also effective in suppressing the generation of crystal defects. Furthermore, because the quartz glass crucible according to the present invention is thermally reinforced, it can be advantageously used for a longer duration of time. The method of production according to the present invention is useful in that it effectively provides a quartz glass crucible of the present invention.

The foregoing specification and drawings have thus described and illustrated a novel improved method for producing a quartz glass crucible for pulling up silicon single crystals and the crucible produced by the method. Many changes, modifications, variations and other uses and applications of the subject invention will, however, become apparent to those skilled in the art after considering this specification which discloses the preferred embodiments thereof. All such changes, modifications, variations and other uses and applications which do not depart from the spirit and scope of the invention are deemed to be covered by the invention, which is to be limited only by the claims which follow.

What we claim is:

1. A method for producing a quartz glass crucible for pulling up silicon single crystals, comprising the following steps:

(a) forming a pre-molding by feeding powdered silicon dioxide into a mold, and by then forming it into a layer along an inner surface of the mold;

(b) forming a crucible base body of a translucent quartz glass layer by heating said pre-molding from the inner side, thereby partially melting said powdered silicon dioxide, followed by cooling and solidifying the melt;

(c) forming a crystallization promoter-containing layer along the internal wall surface of said crucible base body by scattering the crystallization promoter on the surface of the internal wall of the crucible body during or after forming the crucible base body, and d) forming a synthetic quartz glass inner layer by scattering and fusing a powder of silicon dioxide on the crystallization promoter-containing layer that is formed along the internal wall surface of said crucible base body.

2. A method as claimed in claim 1, wherein said step (c) comprises: forming a gaseous atmosphere at a temperature of at least 1800° C. on the inner side of the crucible base body; and supplying the crystallization promoter to a gaseous atmosphere at a temperature of at least 1800° C., thereby melting the crystallization promoter by a gaseous atmosphere at a temperature of at least 1800° C.

3. A method as claimed in claim 2, wherein the amount of the crystallization promoter that is contained in said crystallization promoter-containing layer is in a range of from $1 \times 10^{-5}$ to $1 \times 10^{-8}$ M/cm$^2$, wherein the dimension "cm$^2$" refers to the outer surface area of the inner synthetic quartz glass layer and the dimension M refers to the amount of the crystallization promoter expressed in mol.

4. A method as claimed in claim 3, wherein said crystallization promoter is a barium compound.

5. A method as claimed in claim 2, wherein said crystallization promoter is an element belonging to Group 2a, Group 3a or Group 3b of the Periodic Table.

6. A method as claimed in claim 2, wherein said crystallization promoter is a barium compound.

7. A method as claimed in claim 1, wherein step (d) comprises: forming a gaseous atmosphere at a temperature of at least 1800° C. on the inner side of the crucible base body, and supplying the powder of synthetic silicon dioxide into the gaseous atmosphere to fuse it; and then scattering it against said crystallization promoter-containing layer provided on the internal wall surface of the crucible base body.

8. A method as claimed in claim 7, wherein the amount of the crystallization promoter that is contained in said crystallization promoter-containing layer is in a range of from $1 \times 10^{-5}$ to $1 \times 10^{-8}$ M/cm$^2$, wherein the dimension "cm$^2$" refers to the outer surface area of the inner synthetic quartz glass layer and the dimension M refers to the amount of the crystallization promoter expressed in mol.

9. A method as claimed in claim 7, wherein said crystallization promoter is an element belonging to Group 2a, Group 3a or Group 3b of the Periodic Table.

10. A method as claimed in claim 7, wherein said crystallization promoter is a barium compound.

11. A method as claimed in claim 1, wherein the amount of the crystallization promoter that is contained in said crystallization promoter-containing layer is in a range of from $1 \times 10^{-5}$ to $1 \times 10^{-8}$ M/cm$^2$, wherein the dimension "cm$^2$" refers to an outer surface area of the inner synthetic quartz glass layer and the dimension M refers to the amount of the crystallization promoter expressed in mol.

12. A method as claimed in claim 1, wherein said crystallization promoter is an element belonging to Group 2a, Group 3a or Group 3b of the Periodic Table.

13. A method as claimed in claim 11, wherein said crystallization promoter is a barium compound.

14. A method as claimed in claim 1, wherein said crystalliztion promoter is an element belonging to Group 2a, Group 3a or Group 3b of the Periodic Table.

15. A method as claimed in claim 1, wherein said crystallization promoter is a barium compound.

16. A method as claimed in claim 1, wherein said powdered silicon dioxide used in step a ) is a powder of naturally occurring quartz.

* * * * *